United States Patent
Lee

(10) Patent No.: US 8,503,236 B2
(45) Date of Patent: Aug. 6, 2013

(54) NONVOLATILE MEMORY DEVICE, METHODS OF PROGRAMMING THE NONVOLATILE MEMORY DEVICE AND MEMORY SYSTEM INCLUDING THE NONVOLATILE MEMORY DEVICE

(75) Inventor: Jeong-Woo Lee, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 269 days.

(21) Appl. No.: 13/038,220

(22) Filed: Mar. 1, 2011

(65) Prior Publication Data

US 2011/0216587 A1    Sep. 8, 2011

(30) Foreign Application Priority Data

Mar. 2, 2010    (KR) .................. 10-2010-0018670

(51) Int. Cl.
*G11C 11/34* (2006.01)
(52) U.S. Cl.
USPC ............ 365/185.09; 365/185.12; 365/185.14; 365/185.21; 365/235; 365/238.5
(58) Field of Classification Search
USPC ................. 365/185.92, 235, 238.5, 185.14, 365/185.21, 185.031
See application file for complete search history.

(56) References Cited

U.S. PATENT DOCUMENTS

| 7,159,069 B2 | 1/2007 | Adusumilli et al. |
| 7,372,744 B2 | 5/2008 | Shiga et al. |
| 7,594,157 B2 * | 9/2009 | Choi et al. ................. 714/764 |
| 7,711,895 B2 | 5/2010 | Fukuyama |

FOREIGN PATENT DOCUMENTS

| JP | 2006-073141 | 3/2006 |
| JP | 2007-265271 | 10/2007 |
| KR | 1020050009045 A | 1/2005 |
| KR | 1020070098573 A | 10/2007 |

* cited by examiner

*Primary Examiner* — Jason Lappas
(74) *Attorney, Agent, or Firm* — Muir Patent Consulting, PLLC

(57) ABSTRACT

Embodiments of the inventive concept provide a nonvolatile memory device. The nonvolatile memory device includes a memory cell array, a read/write circuit, and a backup circuit. The memory cell array includes a first memory block including a first word line having first memory cells and a second word line having second memory cells. Each of the first memory cells and second memory cells configured to store first-bit data and second-bit data. The read/write circuit is configured to program data into the first and second memory cells and read data stored in the first and second memory cells. The backup circuit is configured to, after first-bit data are programmed into the first word line, but before second-bit data are programmed into the first word line, store first-bit data stored in the second memory cells of the second word line.

20 Claims, 11 Drawing Sheets

NONVOLATILE MEMORY DEVICE, METHODS OF PROGRAMMING THE NONVOLATILE MEMORY DEVICE AND MEMORY SYSTEM INCLUDING THE NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2010-0018670, filed on Mar. 2, 2010, the entire contents of which are hereby incorporated by reference.

BACKGROUND

The present inventive concept relates to semiconductor memory devices, and more particularly, to methods of programming a nonvolatile memory device.

A semiconductor memory device is a memory device embodied using a semiconductor such as silicon (Si), germanium (Ge), indium phosphide (InP), or the like. Semiconductor memory devices are classified into volatile memory devices and nonvolatile memory devices.

Volatile memory devices lose stored data when not powered. Volatile memory devices may include, for example, a static random access memory (SRAM), a dynamic random access memory (DRAM) and a synchronous DRAM (SDRAM). Nonvolatile memory devices retain stored data even when not powered. Nonvolatile memory devices may include, for example, a read only memory (ROM), a programmable ROM (PROM), an electrically programmable ROM (EPROM), an electrically erasable programmable ROM (EEPROM), a flash memory device, a phase change RAM (PRAM), a magnetic RAM (MRAM), a resistive RAM (RRAM) and a ferroelectric RAM (FRAM). A flash memory device is classified into a NOR type flash memory device and an NAND type flash memory device.

SUMMARY

Embodiments of the inventive concept provide a nonvolatile memory device. The nonvolatile memory device includes a memory cell array, a read/write circuit, and a backup circuit. The memory cell array includes a first memory block including a first word line having first memory cells and a second word line having second memory cells. Each of the first memory cells and second memory cells configured to store first-bit data and second-bit data. The read/write circuit is configured to program data into the first and second memory cells and read data stored in the first and second memory cells. The backup circuit is configured to, after first-bit data are programmed into the first word line, but before second-bit data are programmed into the first word line, store first-bit data stored in the second memory cells of the second word line.

Additional embodiments include a method of programming a nonvolatile memory device including a memory cell array including memory cells configured to store first-bit data and second-bit data. The method comprises receiving second-bit data to be programmed into a first word line among a plurality of word lines of the memory cell array, backing up first-bit data stored in memory cells of a second word line adjacent to the first word line, and subsequent to the backing up, programming the received second-bit data in memory cells of the first word line.

Other embodiments include a method of programming a nonvolatile memory device including memory cells, each cell configured to store at least first-bit data and second-bit data. The method includes receiving first data including first-bit data to be programmed to memory cells connected to a particular word line of the nonvolatile memory device, receiving second data including first-bit data to be programmed to memory cells connected to a different word line of the nonvolatile memory device, and receiving third data including second-bit data to be programmed to the memory cells connected to the particular word line of the nonvolatile memory device. The method additionally includes programming the first data to the memory cells connected to the particular word line and programming the second data to the memory cells connected to the different word line, prior to programming the third data to the particular word line, and storing backup data including a copy of the second data in a backup circuit, prior to programming the third data to the particular word line.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION

Preferred embodiments of the inventive concept will be described below in more detail with reference to the accompanying drawings. The embodiments of the inventive concept may, however, be embodied in different forms and should not be construed as limited to the embodiments set forth herein. Like numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
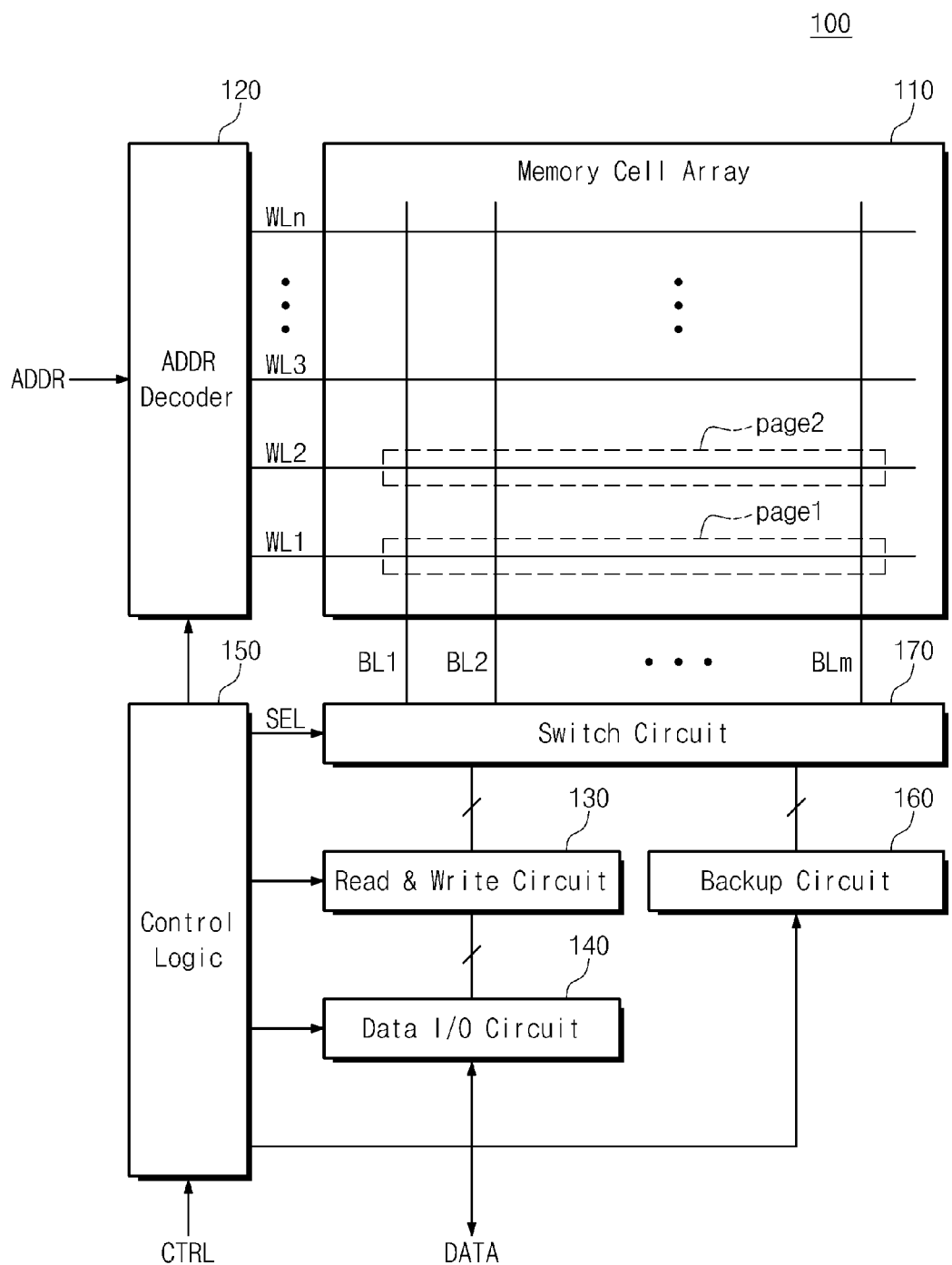
FIG. 1 is a block diagram illustrating a nonvolatile memory device in accordance with an exemplary embodiment of the inventive concept.

FIG. 1 is a block diagram illustrating an exemplary nonvolatile memory device 100 in accordance with an embodiment of the inventive concept.

Referring to FIG. 1, the nonvolatile memory device in accordance with an embodiment of the inventive concept includes a memory cell array 110, an address decoder 120, a read/write circuit 130, a data input/output circuit 140, a control logic 150, a backup circuit 160 and a switch circuit 170.

The memory cell array 110 is connected to the address decoder 120 through word lines WL and is connected to the switch circuit 170 through bit lines BL. The memory cell array 110 includes a plurality of memory cells. As an illustration, memory cells arranged in a row direction are connected to word lines WL1-WLn. Memory cells arranged in a column direction are connected to bit lines BL1-BLm. For example, the memory cells arranged in a column direction form a plurality of cell groups (e.g., a string). The plurality of cell groups are connected to the bit lines BL1-BLm, respectively.

In one embodiment, the memory cell array 110 is comprised of a plurality of memory blocks (not illustrated). Each memory block is comprised of a plurality of pages (e.g., 34 pages, 64 pages). Each page is comprised of a plurality of memory cells (e.g., 512 Byte, 2K Byte) sharing one word line WL. In a case of a NAND flash memory, an erasure operation is performed by a block unit, and a read operation and a writing (i.e., programming) operation are performed by a page unit.

The memory block includes a plurality of cell strings (not illustrated). One cell string (not shown) includes a string select transistor (not shown), a ground select transistor (not shown) and memory cells. The string cell transistor is connected to the bit line BL. The ground select transistor is connected to a common source line (not illustrated). The plurality of memory cells are connected between the string select transistor and the ground select transistor.

The nonvolatile memory device 100 in accordance with an embodiment of the inventive concept can store multi-bit data in one memory cell. For example, first and second data bits may be included in a multi-bit data. The first and second data bits may be the only data bits stored in the memory cell, in which the memory cell is a two-bit memory cell having a most significant bit (MSB) and a least significant bit (LSB). In another embodiment, the first and second data bits may be two of three or more bits stored in one memory cell. In this case, the LSB data or data for a bit closer to the LSB than a high-bit data may be defined as low-bit data. The MSB data or data for a bit closer to the MSB than a low-bit data may be defined as high-bit data. In the nonvolatile memory device 100 in accordance with an embodiment of the inventive concept, low bit data is programmed, and then high bit data is programmed. As an illustration, in one embodiment in a nonvolatile memory device storing two-bit data in each memory cell, the least significant bit (LSB) is first programmed, and then the most significant bit (MSB) is programmed.

The address decoder 120 is connected to the memory cell array 110 through the word lines WL1-WLn. The address decoder 120 is configured to operate in response to a control of the control logic 150. The address decoder 120 receives an address ADDR from the outside (e.g., from a controller outside the memory device 100).

The address decoder 120 is configured to decode a block address among the received addresses ADDR. The address decoder 120 can activate one memory block or a plurality of memory blocks using the decoded block address.

The address decoder 120 is configured to decode a row address among the received addresses ADDR. The address decoder 120 can select word lines WL using the decoded row address.

The address decoder 120 is configured to decode a column address among the received addresses ADDR. The decoded column address is transferred to the read/write circuit 130. Therefore, in one embodiment, the address decoder 120 may include a block decoder, a row decoder, a column decoder and an address buffer.

The read/write circuit 130 is connected to the switch circuit 170 and is connected to the data input/output circuit 140 through data lines DL. The read/write circuit 130 operates in response to a control of the control logic 150. The read/write circuit 130 is configured to receive the decoded column address from the address decoder 120. When the switch circuit 170 connects the memory cell array 110 and the read/write circuit 130 in response to select signal SEL, the read/write circuit 130 selects bit lines BL using the decoded column address.

The read/write circuit 130 receives one page of data from the data input/output circuit 140. The received data is concurrently programmed into a selected page (e.g., page 1) when a program operation is performed. The read/write circuit 130 reads data from a selected page (e.g., page 1) when a read operation is performed and transfers the read data to the data input/output circuit 140.

According to an embodiment of the inventive concept, the read/write circuit 130 can store multi-bit data. As an illustration, in a nonvolatile memory device where two-bit data is stored in each memory cell, when the most significant bit (MSB) data is programmed, the least significant bit (LSB) data of memory cells of the selected word line is stored in the read/write circuit 130. The most significant bit (MSB) data to be programmed is received from the data input/output circuit 140 and is stored in the read/write circuit 130. After that, the most significant bit (MSB) data stored in the read/write circuit 130 is programmed into memory cells of the selected word line on the basis of the stored least significant bit (LSB) data and the stored most significant bit (MSB) data.

As an illustration, the read/write circuit 130 may include a page buffer (or a page register) and a column select circuit.

The data input/output circuit 140 is connected to the read/write circuit 130 through data lines DL. The data input/output circuit 140 operates in response to a control of the control logic 150. The data input/output circuit 140 is configured to exchange data DATA with the outside (e.g., outside of the memory device 100). The data input/output circuit 140 is configured to output data received from the read/write circuit 130 through data lines DL to the outside. As an illustration, the data input/output circuit 140 may include a data buffer.

The control logic 150 may comprise circuitry connected to the address decoder 120, the read/write circuit 130, the data input/output circuit 140, the backup circuit 160 and the switch circuit 170. In one embodiment, the control logic 150 is configured to control the operation of the nonvolatile memory device 100. The control logic operates in response to a control signal CTRL received from the outside.

The backup circuit 160 is connected to the switch circuit 170. The backup circuit 160 operates in response to a control of the control logic 150.

In one embodiment, low-bit data is programmed into memory cells of the first word line (e.g., WL1) and second word line (e.g., WL2). The switch circuit 170 is configured to electrically connect the memory cell array 110 and the backup circuit 160 in response to a select signal SEL. Before high-bit data is programmed into memory cells of the first word line WL1, the low-bit data of the second word line WL2 is stored in the backup circuit 160.

The switch circuit 170 is connected to the memory cell array 110 through the bit lines BL1-BLm. The switch circuit 170 is connected to the read/write circuit 130. The switch circuit 170 is connected to the backup circuit 160. The switch circuit 170 connects the read/write circuit 130 and the memory cell array 110 or connects the backup circuit 160 and the memory cell array 110 in response to the select signal SEL of the control circuit 150. For example, the switch circuit 170 selects between connecting the memory cell array 110 to the read/write circuit 130 and connecting the memory cell array 110 to the backup circuit 160, in response to the select signal SEL.

In one embodiment, the nonvolatile memory device includes at least one of a flash memory, an electrically erasable programmable read only memory (EEPROM), a phase change random access memory (PRAM), a magnetic RAM (MRAM), a ferroelectric RAM (FRAM) and a resistive RAM (RRAM).

Figure 2:
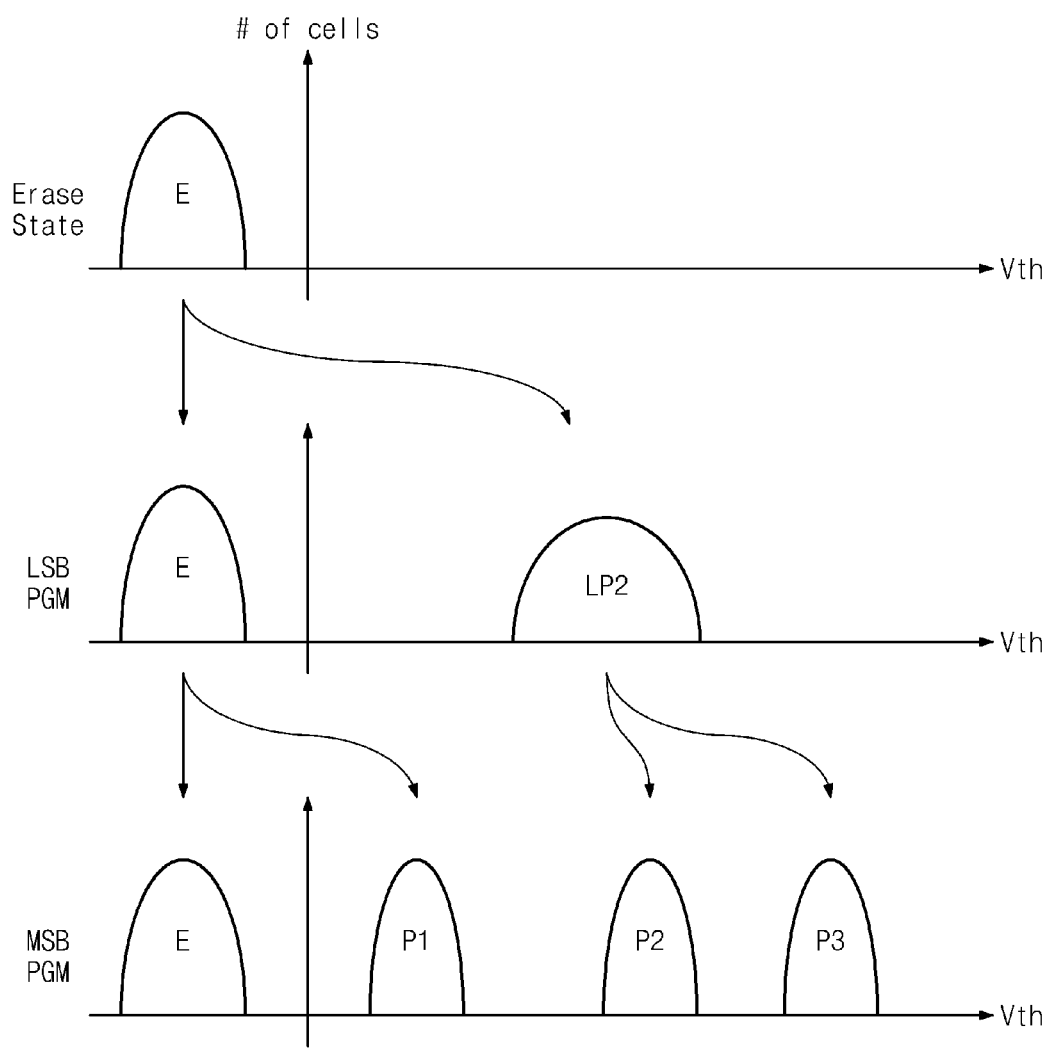
FIG. 2 is an exemplary diagram illustrating a variation of a threshold voltage when high bit data is programmed into a memory cell array illustrated in FIG. 1.

FIG. 2 is a diagram illustrating an exemplary variation of a threshold voltage when high bit data is programmed into a memory cell array illustrated in FIG. 1, according to one embodiment.

As an illustration, FIG. 2 illustrates a voltage distribution state of a case where two-bit data is stored in one memory cell. However, a technical spirit of the inventive concept is not limited to memory cells in which two-bit data are stored. Memory cells may be configured to store more than two bits of data in one cell.

First, when the least significant bit (LSB) is programmed, memory cells can have two states (an erasure state E and a low program state LP2). Memory cells having a threshold voltage corresponding to the erasure state E maintain the erasure state (E), while memory cells having a threshold voltage corresponding to the low program state LP2 may be programmed into the low program state LP2.

After the least significant bit (LSB) data is programmed, the most significant bit (MSB) data is programmed. Memory cells having a threshold voltage corresponding to the erasure state E of the least significant bit (LSB) data may maintain the erasure state E or may be programmed into a first program state P1. Memory cells having a threshold voltage corresponding to the low program state LP2 may be programmed into a second program state P2 or a third program state P3 when the most significant bit (MSB) data is programmed.

Figure 3:
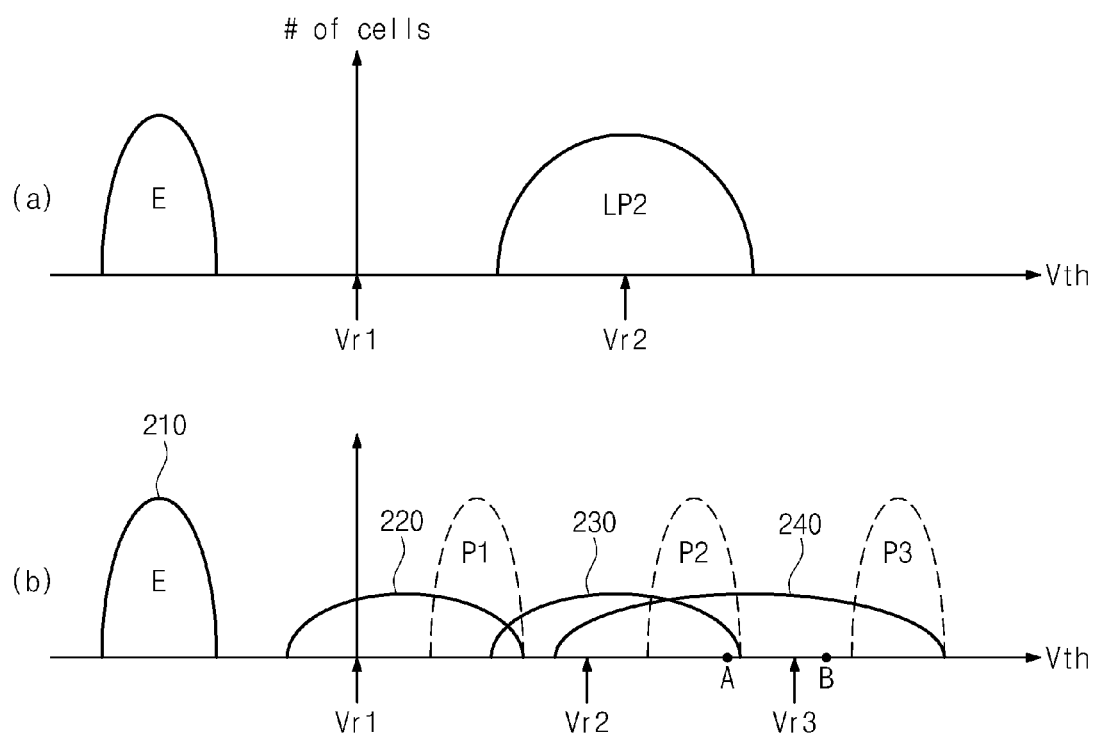
FIG. 3 illustrates an exemplary distribution of threshold voltages of memory cells when a program fail of the most significant bit (MSB) data occurs in the memory cell array of FIG. 1.

FIG. 3 illustrates an exemplary distribution of threshold voltages of memory cells when a program fail of the most significant bit (MSB) data occurs in the memory cell array 100 of FIG. 1, according to one embodiment.

As an illustration, in FIG. 3, a distribution of threshold voltages of memory cells where two-bit data are stored in one memory cell is illustrated. However, a technical spirit of the inventive concept is not limited to memory cells in which two-bit data are stored. Memory cells may be configured to store more than two bits of data.

In FIG. 3, a horizontal axis indicates a threshold voltage of memory cells. A vertical axis indicates the number of memory cells. A first read voltage Vr1, a second read voltage Vr2 and a third read voltage Vr3 are a read voltage for judging a state of memory cells. An expected distribution of threshold voltages by programming the least significant bit (LSB) data or the most significant bit (MSB) data into memory cells may be the same as described with reference to FIG. 2. Thus, a detailed description is omitted.

As an illustration, assume that the memory cells exhibit voltage threshold characteristics according to the expected values shown in FIG. 2. A read operation may be performed on a memory cell of an erasure state E. If the second read voltage Vr2 is used, the memory cell of the erasure state E is first judged to be the erasure state E or the first program state P1. After that, if the first read voltage Vr1 is used, the memory cell of the erasure state E is judged to be the erasure state E. However, as described below, when an actual distribution of threshold voltages varies from the expected distribution, certain errors may occur.

As a program method of a nonvolatile memory device, an increment step pulse program (ISPP) may be used. When a program is performed using the ISPP, a program voltage is applied to each cell of the selected memory cells while the program voltage gradually increases. In one embodiment, for each cell of the selected memory cells to be programmed, the gradually increasing program voltage is applied until that cell is determined to be programmed, after which the gradually increasing program voltage is no longer applied to that cell. The gradually increasing program voltage, however, continues to increase until all cells that should be programmed are determined to be programmed (e.g., all of their threshold voltages have been reached). At that point, the program voltage has reached a designated threshold voltage.

However, in some cases, memory cells may exist that are not supposed to be programmed, but which may have a threshold voltage lower than the designated threshold voltage. As a result, these memory cells may be programmed even though they were not supposed to be programmed, causing errors. This case is referred to as 'program fail'. If a program fail occurs, the distribution of threshold voltages for different program states may overlap, such that certain applied voltages program memory cells that are not supposed to be programmed. Thus, when a program fail occurs, a first distribution 210, a second distribution 220, a third distribution 230 and a fourth distribution 240, such as shown in FIG. 3, may be formed.

As shown in FIG. 3, when memory cells of which the least significant bit (LSB) data is an erasure state E are programmed into an erasure state (E, 210) for the most significant bit (MSB) data, threshold voltages of the memory cells are maintained. Thus, the memory cells have a threshold voltage corresponding to the first distribution 210.

When memory cells having the erasure state E are programmed to have the first program state P1, if a program fail occurs, memory cells having a threshold voltage corresponding to the second distribution 220 may exist. Some of the memory cells having a threshold voltage corresponding to the second distribution 220 may have a threshold voltage lower than the first read voltage Vr1. Thus, a read error occurs.

When memory cells having the program state LP2 are programmed to have the second program state P2, if a program fail occurs, memory cells having a threshold voltage corresponding to the third distribution 230 may exist. Among the memory cells having a threshold voltage corresponding to the third distribution 230, some memory cells having a voltage distribution lower than the second read voltage Vr2 may exist. Thus, a read error occurs.

When memory cells having the program state LP2 are programmed to have the third program state P3, if a program fail occurs, memory cells having a threshold voltage corresponding to the fourth distribution 240 may exist. Among the memory cells having a threshold voltage corresponding to the fourth distribution 240, some memory cells having a voltage distribution lower than the second read voltage Vr2 may exist. Thus, a read error occurs. If a read error occurs, low bit data already programmed may be damaged.

As an illustration, assume that the erasure state E is set to data '11', the first program state P1 is set to data '01', the second program state P2 is set to data '10' and the third program state P3 is set to data '00'. That is, the least significant bit (LSB) data of the erasure state E and the first program state P1 is set to '1'. The least significant bit (LSB) data of the second program state P2 and the third program state P3 is set to '0'. The most significant bit (MSB) data of the erasure state E and the second program state P2 is set to '1'. The most significant bit (MSB) data of the first program state P1 and the third program state P3 is set to '0'.

On the assumption as above, the least significant bit (LSB) data of the second program state P2 is '0'. However, memory cells having a voltage distribution lower than the second read voltage Vr2 among memory cells having a threshold voltage corresponding to the third distribution 230 may exist. The least significant bit (LSB) data of these memory cells is judged to be '1'. For these cells, the least significant bit (LSB) data should be judged to be '0', but is erroneously judged to be '1'. Thus, memory cells for which the least significant bit (LSB) data is damaged may exist.

Similarly, the least significant bit (LSB) data of the third program state P3 is '0'. However, memory cells having a voltage distribution lower than the second read voltage Vr2 among memory cells having a threshold voltage corresponding to the fourth distribution 240 may exist. For these cells, the least significant bit (LSB) data should be judged to be '0' but is erroneously judged to be '1'. Therefore, memory cells for which the least significant bit (LSB) data is damaged may exist.

Figure 4:
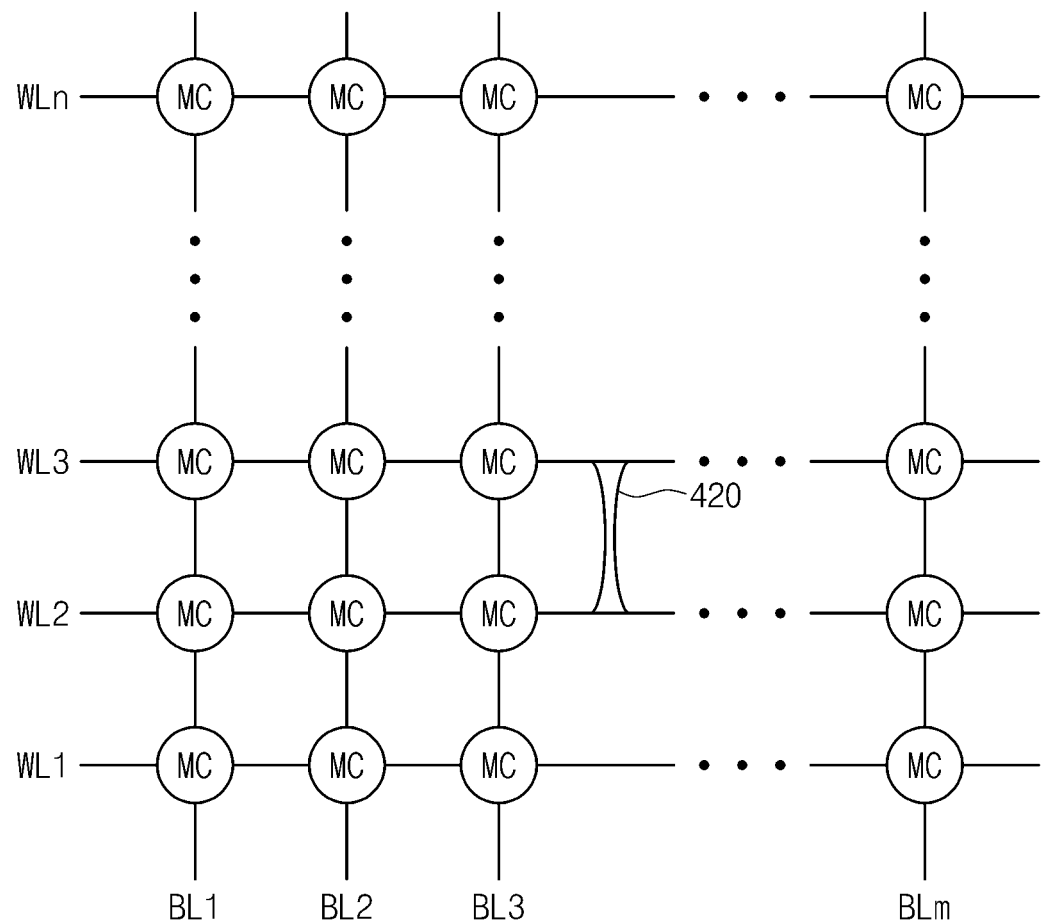
FIG. 4 is an exemplary diagram in which a memory cell array of FIG. 1 is more specifically illustrated.

FIG. 4 is an exemplary diagram in which a memory cell array of FIG. 1 is more specifically illustrated, according to one embodiment. In one embodiment, the memory cell array 400 illustrated in FIG. 4 is configured to be operable as part of the memory cell array 100 illustrated in FIG. 1.

Referring to FIG. 4, memory cells arranged in a row direction are connected to word lines WL1-WLn. Memory cells arranged in a column direction are connected to column line BL1-BLm. For example, memory cells arranged in a row direction form a plurality of cell groups (e.g., strings). The plurality of cell groups are connected to the bit lines BL, respectively. In one embodiment, each memory cell is a memory cell in which multi-bit data is stored.

Memory cells of a memory block are programmed in the predetermined order by a word line unit in order to reduce a coupling effect between a memory cell of a selected word line and adjacent memory cells.

In one embodiment, in the memory cell array 400, two bits of data are stored in each memory cell. The least significant bit (LSB) data are programmed into memory cells of a first word line WL1 and the least significant bit (LSB) data are programmed into memory cells of a second word line WL2. The most significant bit (MSB) data are programmed into memory cells of the first word line WL1 and the least significant bit (LSB) data are programmed into memory cells of a third word line WL3. After that, the most significant bit (MSB) data are programmed into memory cells of the second word line WL2, and this pattern continues. This is called a scramble program.

According to the scramble program, in the case that the most significant bit (MSB) data is programmed into a memory cell of the selected word line, the least significant bit (LSB) data might be already programmed into memory cells of adjacent unselected word line. However, the inventive concept is not limited to the scramble program. Other program methods may be used as well.

As an illustration, in the case where the most significant bit (MSB) data is programmed into memory cells of the first word line WL1, the least significant bit (LSB) data was already programmed into memory cells of the second word line WL2. Similarly, in the case where the most significant bit (MSB) data is programmed into memory cells of the second word line WL2, the least significant bit (LSB) data was already programmed into memory cells of the third word line WL3.

An unwanted connection (hereinafter referred to as a bridge 420) between word lines may occur due to problems in a process, or a continuous use of the nonvolatile memory device 100. For example, the bridge may occur due to deterioration (e.g., repetition of a program and an erasure) of a memory cell and an electrical connection. The bridge may cause an unwanted current to flow between word lines, and may therefore cause charges stored in certain memory cells of a given row to increase when the adjacent row is programmed, thereby changing the threshold voltages of those cells.

When the most significant bit (MSB) data is programmed, a program fail may occur in memory cells of the selected word line. In this case, low bit data (e.g., LSB) of memory cells sharing the selected word line may be damaged. In addition, a program voltage applied to the selected word line may also be applied to an unselected word line having a bridge formed between the selected word line and the unselected word line. Thus, low bit data of memory cells of the unselected word line having a bridge formed between the selected word line and the unselected word line may be damaged for the same reason as the reason described with reference to FIG. 3.

As shown in FIG. 4, for example, the bridge 420 may occur between the second word line WL2 and the third word line WL3. In the case that a program fail of the most significant bit (MSB) data occurs in a memory cell of the second word line WL2, the least significant bit (LSB) data of the third word line WL3 may be damaged.

In order to avoid this problem, the nonvolatile memory device 100 in accordance with an embodiment of the inventive concept stores the least significant bit (LSB) data of memory cells of an unselected word line adjacent to the selected word line in the backup circuit (160 of FIG. 1) before the most significant bit (MSB) data are programmed into memory cells of the selected word line.

Figure 5:
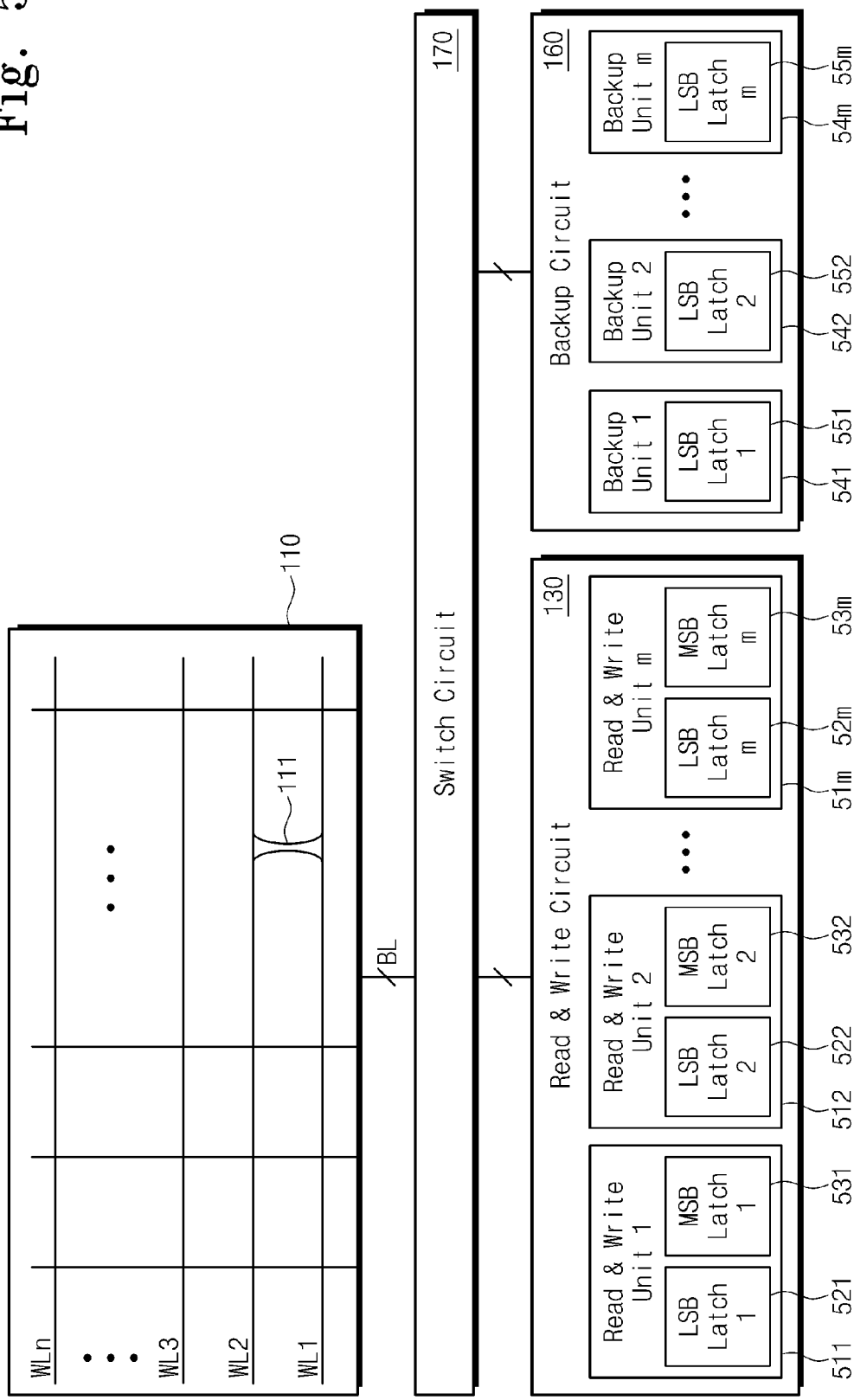
FIG. 5 is an exemplary block diagram in which a memory cell array, a read/write circuit, a backup circuit and a switch circuit are illustrated, according to one embodiment.

FIG. 5 is an exemplary block diagram in which the memory cell array 110, the read/write circuit 130, the backup circuit 160 and the switch circuit 170 that are illustrated in FIG. 1 are illustrated, according to one embodiment.

In FIG. 5, as an illustration, a program operation of the nonvolatile memory device 100 where two bits of data are stored in each memory cell is described. However, an embodiment of the inventive concept may also be applied to a nonvolatile memory device in which at least three bits of data are stored in each memory cell.

The memory cell array 110 is constituted as described with reference to FIG. 1. In one embodiment, in the memory cell array 110, a bridge 111 is formed between a first word line WL1 and a second word line WL2. The bridge 111 illustrated in FIG. 5 is similar to the bridge 420 described with reference to FIG. 4.

The read/write circuit 130 includes read/write units 511-51m. One read/write unit (e.g., a first read/write unit 511) includes a plurality of latches (e.g., a first low bit latch 521 and a first high bit latch 531). In FIG. 5, one read/write unit includes two latches. However, one read/write unit may include three latches.

The read/write circuit 130 is connected to the switch circuit 170. The read/write circuit 130 is connected to the memory cell array 110 through the switch circuit 170. In one embodiment, the read/write circuit 130 receives one page of data from the data input/output circuit 140. The received data is programmed into a selected page when a program operation is performed. The read/write circuit 130 reads data from a selected page when a read operation is performed and transfers the read data to the data input/output circuit 140.

The backup circuit 160 includes a plurality of backup units 541-54m. One backup unit (e.g., a first backup unit 541) includes one latch (e.g., a first low bit latch 551). In FIG. 5, one backup unit includes one latch. However, one backup unit may include two or more latches.

The backup circuit 160 is connected to the memory cell array 110 through the switch circuit 170. The least significant bit (LSB) data stored in memory cells of an unselected word line are stored in the backup circuit 160.

The unselected word line may be a word line adjacent to the selected word line. For example, the unselected word line may be a word line located between the selected word line and a ground select line (not shown) and immediately adjacent to the selected word line.

The switch circuit 170 connects the memory cell array 110 and the read/write circuit 130 in response to a select signal SEL of the control logic 150. Also, the switch circuit 170 connects the memory cell array 110 and the backup circuit 160 in response to the select signal SEL of the control logic 150.

As an illustration, when a program operation or a read operation of the nonvolatile memory device 100 is performed, the switch circuit 170 connects the memory cell array 110 and the read/write circuit 130 in response to the select signal SEL of the control logic 150. In the case that low-bit data is backed up in the backup circuit 160, the switch circuit 170 connects the memory cell array 110 and the backup circuit 160.

An embodiment of the inventive concept may be applied to a nonvolatile memory device where at least three bits of data are stored in one memory cell. As an illustration, in a nonvolatile memory device where three bits of data are stored in one memory cell, two bits of data for each cell may be stored in a backup circuit. Thus, two latches are provided to backup units of the backup circuit.

As described with reference to FIG. 3, when a program fail of the most significant bit (MSB) data occurs in memory cells of the selected word line, the least significant bit (LSB) data of memory cells of an unselected word line may be damaged. As an illustration, assume that the least significant bit (LSB) data is programmed into memory cells of first and second word lines WL1 and WL2. At this time, assume that a bridge is formed between the first and second word lines WL1 and WL2. When a program fail of the most significant bit (MSB) data of the first word line WL1 occurs, not only the least significant bit (LSB) data of the first word line WL1, but also the least significant bit (LSB) data of the second word line WL2 may be damaged.

In the case where the most significant bit (MSB) data is programmed, first, the least significant bit (LSB) data of memory cells of the selected word line are stored in the read/write circuit 130. At this time, the switch circuit 170 connects the memory cell array 110 and the read/write circuit 130 in response to the select signal SEL. The least significant bit (LSB) data of memory cells of the selected word line may then be stored in low bit latches 521-52m of the read/write units 511-51m.

The most significant bit (MSB) data to be programmed is received from the data input/output circuit 140. The received the most significant bit (MSB) data may be stored in high bit latches 531-53m of the read/write units 511-51m. The stored most significant bit (MSB) data is programmed into memory cells of the selected word line. When a program operation is performed, the switch circuit 170 connects the memory cell array 110 and the read/write circuit 130 in response to the select signal SEL. In one embodiment, in case of a program fail when the MSB data programming occurs, the read/write circuit 130 may be used to recover the least significant bit (LSB) data of memory cells of the stored selected word line.

The nonvolatile memory device 100 in accordance with an embodiment of the inventive concept includes the backup circuit 160 for backing up the least significant bit (LSB) data of memory cells of an unselected word line. The least significant bit (LSB) data of memory cells of an unselected word line may be stored in the backup circuit 160. The switch circuit 170 may connect the memory cell array 110 and the backup circuit 160 in response to the select signal SEL. The backup circuit 160 may be used to recover the least significant bit (LSB) data of memory cells of an unselected word line when a program fail occurs.

When a program fail occurs, a memory block from which an error is generated is treated to be a bad block. A program operation may then be performed in another memory block from which an error is not generated. The other memory block corresponds to a normal, correctly operating storage region.

In this case, when programming the data to the other memory block, the least significant bit (LSB) data of memory cells of the selected word line may be provided from the read/write circuit 130, and the least significant bit (LSB) data of memory cells of an unselected word line may be provided from the backup circuit 160.

Figure 6:
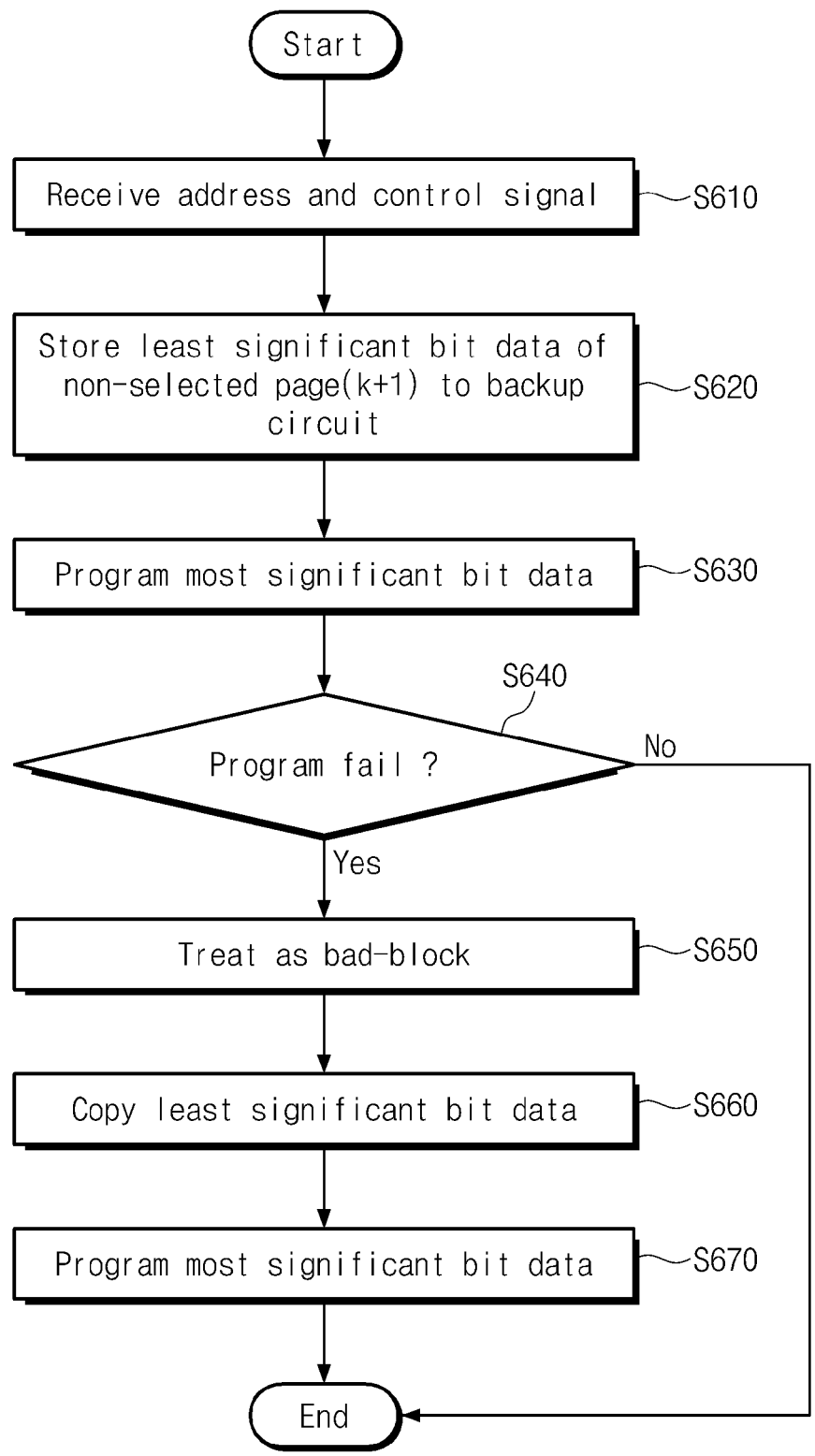
FIG. 6 is a flow chart illustrating an exemplary program method of the most significant data (MSB) data of the nonvolatile memory device illustrated in FIG. 1.

FIG. 6 is a flow chart illustrating an exemplary program method of the most significant data (MSB) data of the nonvolatile memory device 100 illustrated in FIG. 1.

As an illustration, a program method of a nonvolatile memory device where two bits of data are stored in each memory cell is described with reference to FIG. 6. However, the inventive concept may be applied to other program methods, such as a program method of a nonvolatile memory device where at least three bits of data are stored in each memory cell.

Referring to FIGS. 1 and 6, in step S610, the nonvolatile memory device 100 receives an address signal ADDR and a control signal CTRL. The address decoder 120 decodes the received address signal ADDR to activate a memory block to be programmed. The address decoder 120 can select a word line of the activated memory block.

The control logic 150 operates in response to the received control signal CTRL. The control logic 150 controls the address decoder 120, the read/write circuit 130, the data input/output circuit 140, and the backup circuit 160.

In step S620, the least significant bit (LSB) data of memory cells of an unselected word line are stored in the backup circuit 160. At this time, the switch circuit 170 connects the memory cell array 110 and the backup circuit 160 in response to the select signal SEL. The unselected word line may be a word line immediately adjacent to the selected word line. The unselected word line may be located between the selected word line and a string select line (not illustrated) and may be a word line immediately adjacent to the selected word line.

In step S630, the most significant bit (MSB) data is programmed into memory cells of the selected word line. At this time, the switch circuit 170 connects the memory cell array 110 and the read/write circuit 130 in response to the select signal SEL. More specifically, step S630 may include a step where the read/write circuit 130 receives the most significant bit (MSB) data to be programmed from the data input/output circuit 140, a step where the read/write circuit 130 reads the least significant bit (LSB) data of memory cells of the selected word line and after that, a step where the most significant bit (MSB) data stored in the read/write circuit 130 is programmed into memory cells of the selected word line.

Alternatively, before the read/write circuit 130 receives data to be programmed from the data input/output circuit 140, the read/write circuit 130 can first perform a step of reading the least significant bit (LSB) data of memory cells of the selected word line.

A step where the least significant bit (LSB) data of memory cells of an unselected word line is stored in the backup circuit 160, a step where the read/write circuit 130 reads the least significant bit (LSB) data of memory cells of the selected word line, and a step where the read/write circuit 130 receives the most significant bit (MSB) data to be programmed from the data input/output circuit 140 may be performed regardless of the order.

For example, the step where the read/write circuit 130 receives the most significant bit (MSB) data to be programmed from the data input/output circuit 140 may be performed together with the step where the read/write circuit 130 reads the least significant bit (LSB) data of memory cells of the selected word line or the step where the least significant bit (LSB) data of memory cells of an unselected word line is stored in the backup circuit 160.

In one embodiment, the step where the least significant bit (LSB) data of memory cells of an unselected word line is stored in the backup circuit 160 is performed before a step where the most significant bit (MSB) data is programmed into memory cells of the selected word line. By storing the least significant bit (LSB) data of memory cells of an unselected word line in the backup circuit 160 before programming the MSB of an adjacent cell, the LSB data can be recovered if the least significant bit (LSB) data of memory cells of an unselected word line are damaged.

In a step of S640, it is judged whether a program fail occurs or not. As described with reference to FIG. 2, a program fail means that memory cells do not have a normal threshold voltage as a result of a program operation being performed.

If a program fail of the most significant bit (MSB) data occurs in memory cells of the selected word line, the least significant bit (LSB) data of memory cells of the selected word line and memory cells of an unselected word line may be damaged.

If a program fail does not occur, a program of the most significant bit (MSB) data is over.

In a step of S650, in the case that a program fail occurs, a memory block in which a program is performed is treated to be a bad block.

In a step of S660, the least significant bit (LSB) data stored in the backup circuit 160 and the least significant bit (LSB) data stored in the read/write circuit 130 are programmed into another memory block of the memory cell array 110 in FIG. 1, which is not the bad block. At this time, data which is already correctly programmed in the bad block may be copied into other memory block. For example, data that is already programmed in a block treated as a bad block may be outputted to the outside (e.g., a controller) of a nonvolatile memory device, inputted into the inside of the nonvolatile memory device again, and copied into another memory block of the nonvolatile memory device.

In step S670, the most significant bit (MSB) data inputted for a program in the step of S630 is programmed into the other memory block again. After finishing this program operation, a program of the most significant bit (MSB) data is over.

A program method of a nonvolatile memory device where two-bit data are stored in one memory cell was described with reference to FIG. 6. However, an embodiment of the inventive concept is not limited to such a program method. For example, in one embodiment, a four-bit data may be stored in one memory cell. In the case that third bit data (3SB) are programmed into memory cells of the selected word line, the least significant bit (LSB) data and second bit data (2SB) of memory cells of an unselected word line may be stored in the backup circuit 160.

Figure 7:
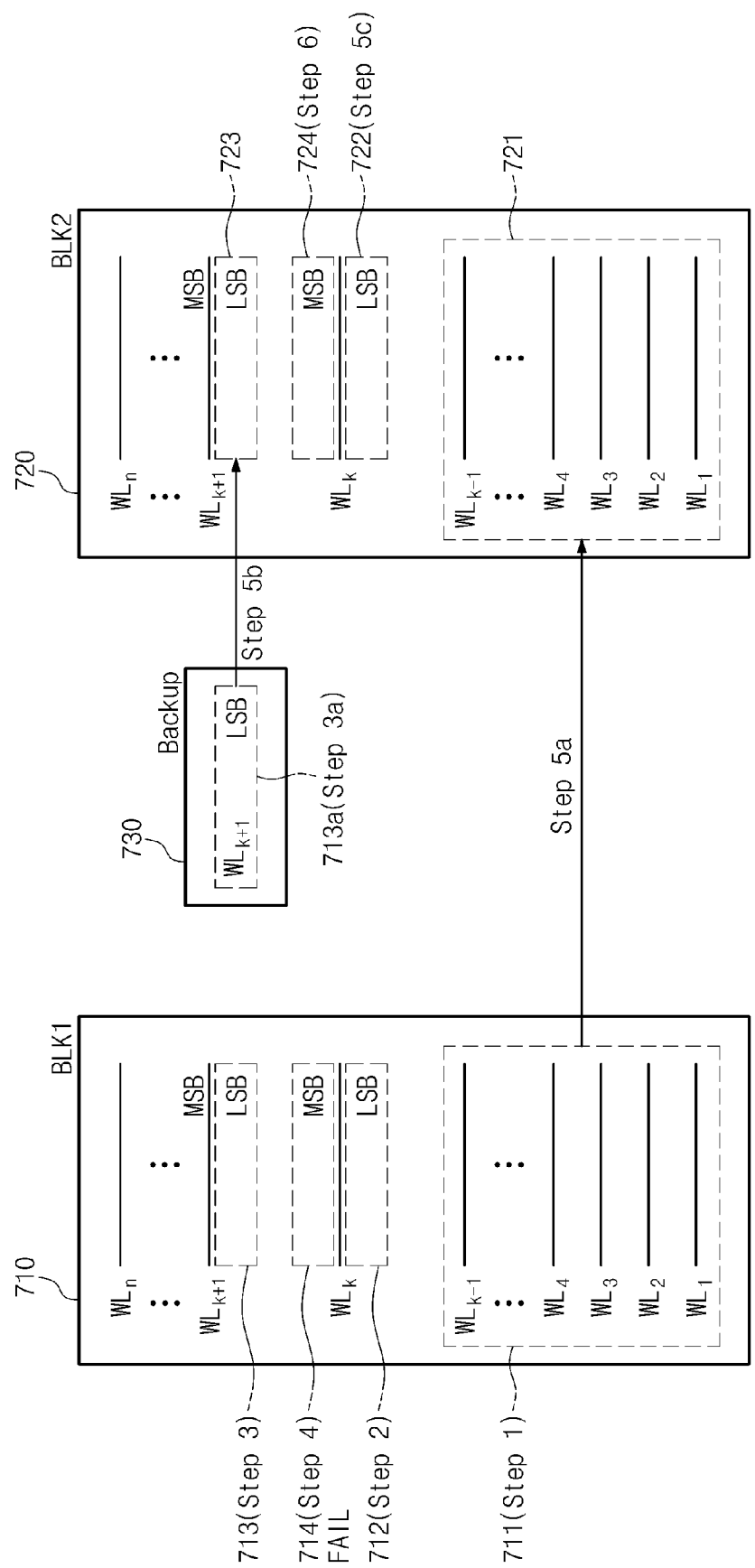
FIG. 7 is an exemplary diagram showing memory blocks, a backup circuit, and a method according to certain embodiments.

FIG. 7 depicts an exemplary operation of a semiconductor memory device, in accordance with one embodiment. FIG. 7 depicts a first memory block (BLK1) 710, a second memory block (BLK2) 720, and a backup circuit 730. For simplicity, for memory blocks 710 and 720, and backup circuit 730, FIG. 7 only depicts certain features and elements for the purpose of this description. However, memory blocks 710 and 720, and backup circuit 730 will include additional elements not shown in FIG. 7.

First memory block 710 includes a plurality of word lines WL1-WLn. Each word line, which represents a page of data, includes a plurality of transistors, each connected to a bit line. In one embodiment, each transistor can store a plurality of data bits. For example, each transistor may store two bits, a LSB and a MSB. As discussed previously, when programming the different word lines having multi-level (e.g., 2-bit or higher) cells, control logic may implement a scramble sequence, where first-bit (e.g., LSB) data on a first word line is programmed; second, first-bit (e.g., LSB) data on a second word line (e.g., a word line adjacent the first word line) is programmed; third, second-bit (e.g., MSB) data on the first word line is programmed; fourth, first-bit (e.g., LSB) data on a third word line (e.g., adjacent the second word) line is programmed, etc. At some time between a given word line's first bit programming and the beginning of the previous word line's second bit programming, the given word line's first bit data is stored in a backup circuit. For example, in one embodiment, a second word line's first-bit data may be stored in the backup circuit while second-bit data intended for the first word line is being stored in a read/write circuit, but prior to the second-bit data being programmed to the first word line.

FIG. 7 depicts a situation where data is first programmed to a first memory block 710, then one of the word lines during programming is determined to be damaged, and then as a result, valid data already stored in the first memory block 710 as well as the data stored in backup circuit 730 and data stored in an input/output circuit is copied to a second memory block 720, and the programming procedure continues in the second memory block 720.

Specifically, in step 1, data is sequentially programmed to a group of word lines WL1-WLk-1 (711), in first memory block 710. The data is correctly programmed. In step 2, LSB data is programmed to a first word line WLk (712) when the first word line is selected and other word lines are unselected. In step 3, LSB data is programmed to a second word line WLk+1 (713) when the second word line is selected and other word lines are unselected. For example, the second word line may be a word line directly adjacent to the first word line. In step 3a, at some time prior to the start of programming MSB data to the first word line WLk, the LSB data for the second word line WLk+1 is stored in a backup circuit 730 (e.g., in a set of backup latches 713a). The data can be stored in the backup circuit 730 simultaneously with the programming of the LSB data to second word line WLk+1, or it may be stored either before programming begins or after the programming of the LSB data is complete to second word line WLk+1, so long as it occurs prior to the start of programming MSB data to the first word line WLk.

In step 4, MSB programming occurs in the first word line WLk (714), but an error occurs such that the data is not properly programmed (FAIL), and so it is determined that the first word line WLk, and therefore memory block 710, is damaged. In addition, in a situation where there is a bridge between the first word line WLk and the second word line WLk+1, the second word line WLk+1 may be damaged as well.

As a result, because memory block 710 is damaged, the data already correctly stored in memory block 710, as well as the data from the backup circuit 730 is copied to a second memory block 720, and the process of programming data into the second memory block 720 continues. More specifically, in step 5a, data correctly stored in memory cells of word lines WL1-WLk-1 (711) of memory block 710 are copied to word lines WL1-WLk-1 (721) of memory block 720. In step 5b, which may occur simultaneously, or before or after step 5a, the second word line WLk+1 LSB data stored in backup circuit 730 is copied into word line WLk+1 (723) of second memory block 720. In one embodiment, backup circuit 730 may store data for multiple word lines (e.g., it may store LSB data for WLk as well as LSB data for WLk+1, WLk-1, or other word lines that may be affected by potential bridges), such that the multiple word lines of data can be copied to multiple word lines of the second memory block 720 in step 5b. In step 5c, for any MSB or LSB data not stored in backup circuit 730, for word lines that were determined to be damaged (e.g., as shown in FIG. 7, WLk LSB 722 and MSB 724), that data is programmed to the second memory block 720 (steps 5c and 6). For example, the first word line WLk LSB data may still be stored in a read/write circuit (e.g., read/write circuit 130), and that data may be copied from the read/write circuit into word line WLk of second memory block 710. After the appropriate data is copied into the second memory block 720, the scramble procedure for programming the data continues for the second memory block 720.

In general, the embodiments described herein include situations using multi-level cells, where a data for a particular bit (e.g., a first bit, which may be a LSB) for cells connected to a particular, first word line are programmed first, data for the particular bit for cells connected to a different, second word line are programmed second, and subsequently, data for a different bit (e.g., a second bit, which may be a MSB) for the cells connected to the first word line are then programmed third. The word lines may be directly adjacent, or nearby (e.g., separated by a small enough number of rows, such as one or two, such that voltages applied to the first word line affect the data stored in cells connected to the second word line). Some time prior to the third programming step (e.g., before the third programming begins), the data from the first and/or second programming steps is stored in a backup circuit, so that if the third programming step fails, the already programmed data from the first and/or second programming steps can be easily copied to a new memory block. As described above, the pattern for programming LSB and MSB data to word lines of a memory block may follow a scramble pattern such as described previously. However, other patterns may be used without departing from the scope of the disclosed embodiments.

Figure 8:
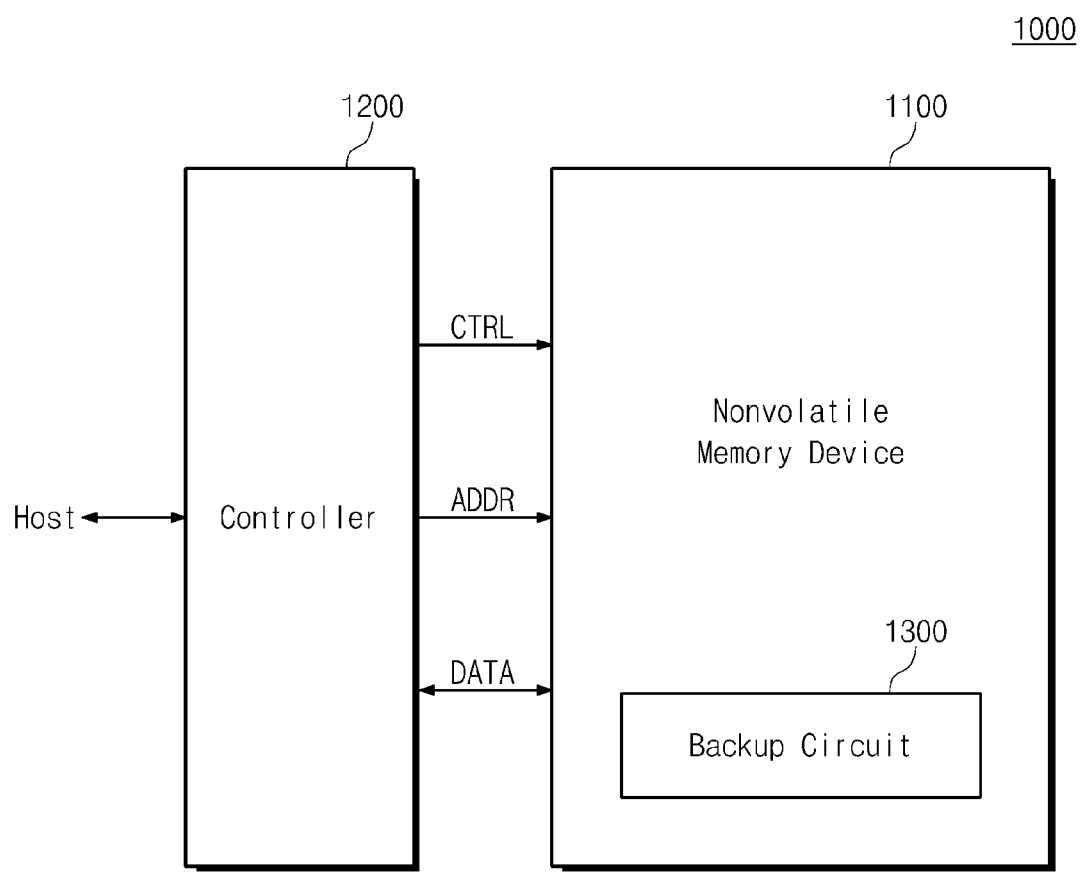
FIG. 8 is a block diagram illustrating an exemplary memory system including a nonvolatile memory device, according to certain embodiments.

FIG. 8 is a block diagram illustrating an exemplary memory system 1000 including a nonvolatile memory device 1100, according to certain embodiments. Referring to FIG. 8, the memory system 100 includes a nonvolatile memory device 1100 and a controller 1200.

The nonvolatile memory device 1100 includes a backup circuit 1300. In one embodiment, he nonvolatile memory device 1100 has the same constitution as the nonvolatile memory device 100 described with reference to FIGS. 1 and 5. The backup circuit 1300 may have the same constitution as the backup circuit 130 described with reference to FIGS. 1 and 5.

The controller 1200 is connected to a host and the nonvolatile memory device 1100. The controller 1200 is configured to access the nonvolatile memory device 1100 in response to a request from the host. For example, the controller 1200 is configured to control read, erasure and background operations of the nonvolatile memory device 1100. The controller 1200 is configured to drive firmware for controlling the nonvolatile memory device 1100.

As an illustration, referring to FIGS. 1 and 8, the controller 1200 is configured to provide a control signal CTRL and an address ADDR to the nonvolatile memory device 1100. The controller 1200 is configured to exchange data with the nonvolatile memory device 1100.

The controller 1200 further includes well known constituent elements such as a random access memory (RAM), a processing unit, a host interface and a memory interface. A RAM is used as at least one of an operation memory of a processing unit, a cache memory between the nonvolatile memory device 1100 and the host and a buffer memory between the nonvolatile memory device 1100 and the host. The processing unit controls the operations of the controller 1200.

The host interface includes a protocol for performing data exchange between the host and the controller 1200. The controller 1200 is configured to communicate with the outside through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE). A memory interface interfaces with the nonvolatile memory device 1100. For example, the memory interface may include a NAND type interface and a NOR type interface.

The memory system 1000 may be configured to further include an error correction block. The error correction block is configured to detect and correct an error of data read from the nonvolatile memory block 1100 using an error correction code ECC. As an illustration, the error correction block is provided as a constituent element of the controller 1200. The error correction block is provided as a constituent element of the nonvolatile memory device 1100.

The controller 1200 and the nonvolatile memory device 1100 can be integrated into one semiconductor device. As an illustration, the controller 1200 and the nonvolatile memory device 1100 can be integrated into one semiconductor device to constitute a memory card. For example, the controller 1200 and the nonvolatile memory device 1100 can be integrated into one semiconductor device to constitute a memory card such as a personal computer memory card international association (PCMCIA), a compact flash card (CF), a smart media card (SM, SMC), a memory stick, a multimedia card (MMC, RS-MMC, MMCmicro), SD card (SD, miniSD, microSD, SDHC), a universal flash memory device (UFS) or the like.

The controller 1200 and the nonvolatile memory device 1100 may be integrated into one semiconductor device to constitute a solid state drive (SSD). The solid state drive (SSD) includes a storage device constituted so as to store data in a semiconductor memory. In the case that the memory system 1000 is used as a solid state drive (SSD), an operation speed of the host connected to the memory system is greatly improved.

In another example, the memory system 1000 is provided as one of various constituent elements of an electronic device such as a computer, an ultra mobile PC (UMPC), a work station, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a digital multimedia broadcasting (DMB) player, a digital audio recorder, a digital audio player, a digital picture recorder, a digital picture player, a digital video recorder, a digital video player, a device which can transmit and receive information in a wireless environment, one of various electronic devices constituting a home network, one of various electronic devices constituting a computer network, one of various electronic devices constituting a telematics network, or one of various electronic devices constituting an RFID device or a computing system.

The nonvolatile memory device 1100 or the memory system 1000 may be mounted with various types of packages. For example, a flash memory device or a memory system according to the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

Figure 9:
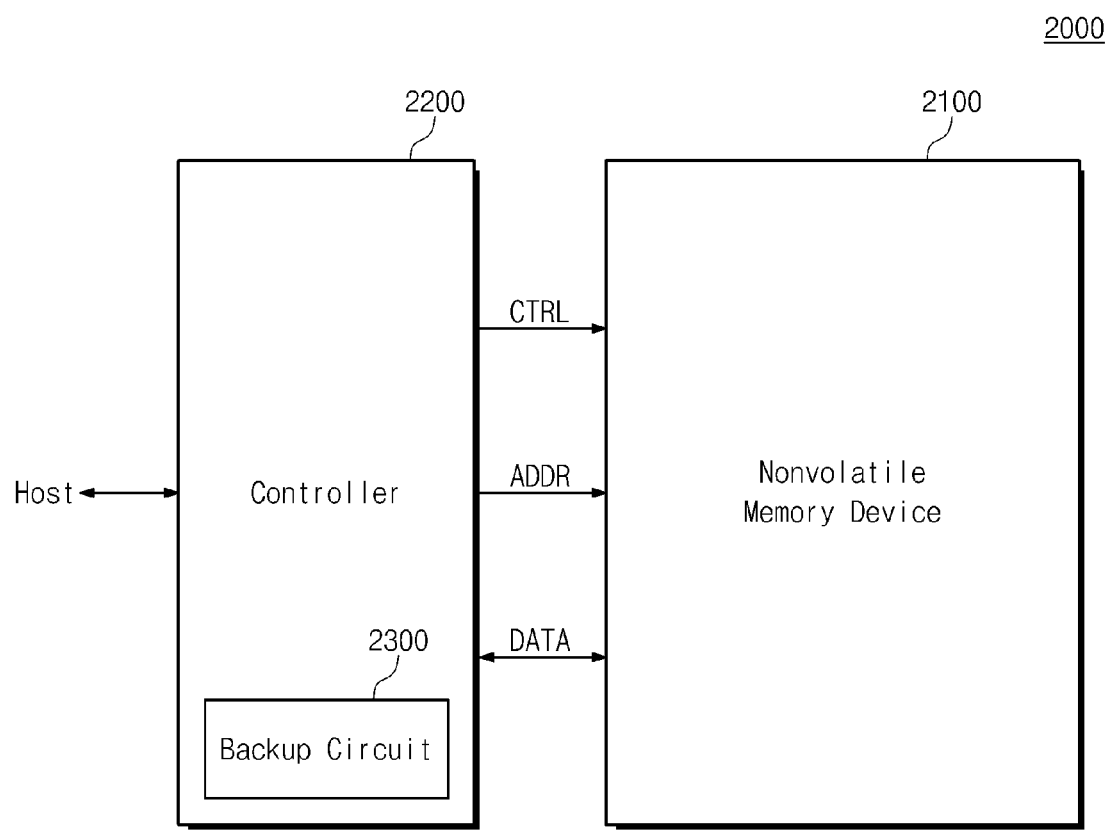
FIG. 9 is a block diagram illustrating an exemplary memory system including a nonvolatile memory device, according to certain embodiments.

FIG. 9 is a block diagram illustrating an exemplary memory system 2000 including a nonvolatile memory device 2100, according to one embodiment. Referring to FIG. 9, the memory system 2000 includes a nonvolatile memory device 2100 and a controller 2200.

The nonvolatile memory device 2100 may have the same constitution as the nonvolatile memory device 100 described with reference to FIGS. 1 through 8, except that the nonvolatile memory does not provide a function of the backup circuit 160.

The controller 2200 includes a backup circuit 2300. The controller 2200 may have the same constitution as the controller 1200 described with reference to FIG. 8, except that the controller 2200 provides a function of the backup circuit 2300. The backup circuit 2300, as described with reference to FIGS. 1 through 7, stores low bit data of an unselected word line adjacent to the selected word line.

Figure 10:
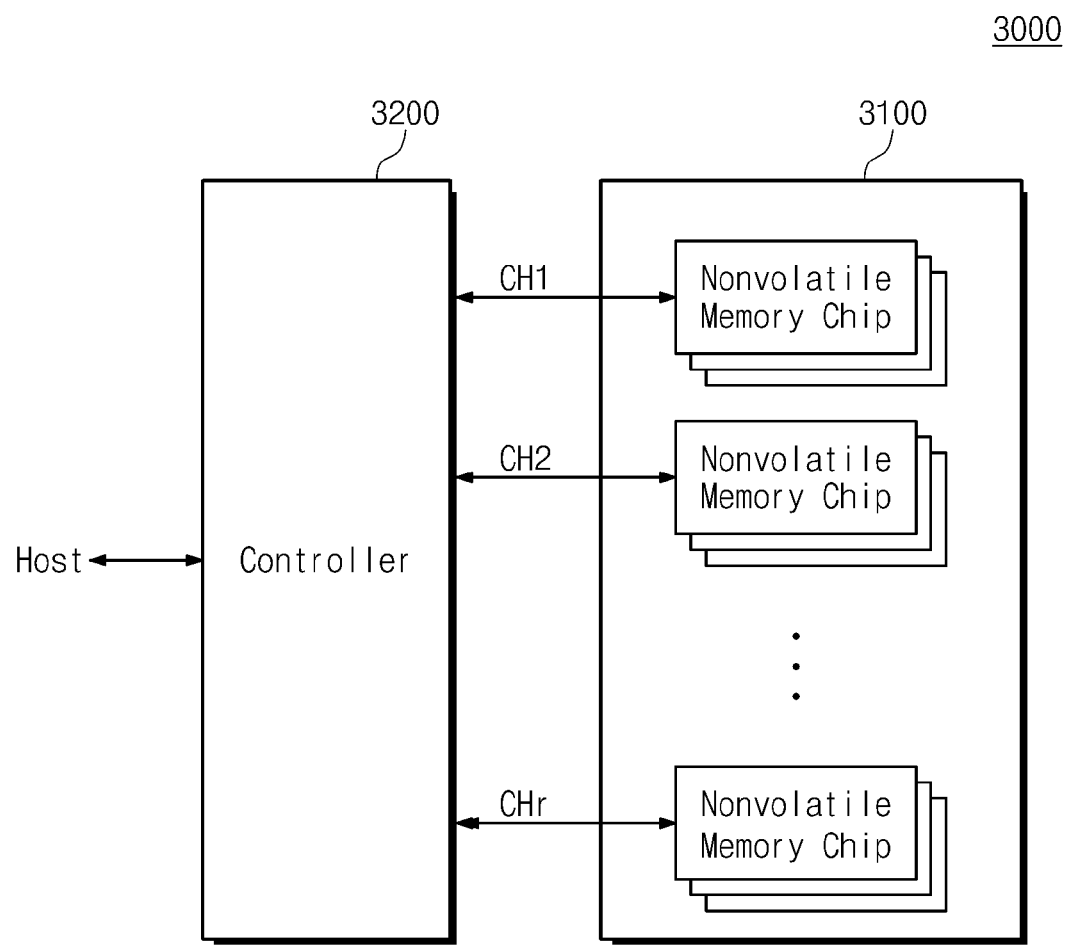
FIG. 10 is a block diagram illustrating an application example of the memory system of FIG. 8, according to certain embodiments.

FIG. 10 is a block diagram illustrating an exemplary application example of the memory system 1000 of FIG. 8, according to one embodiment.

A controller 3200 may have the same constitution as the controller 1200 described with reference to FIG. 8.

Referring to FIG. 10, a memory system 3000 includes a nonvolatile memory device 3100 and the controller 3200. The nonvolatile memory device 3100 includes a plurality of memory chips. The plurality of memory chips is divided into a plurality of groups. Each group of the plurality of nonvolatile memory chips is configured to communicate with the controller 3200 through one common channel. In FIG. 10, it is illustrated that a plurality of nonvolatile memory chips communicates with the controller 3200 through channels CH1-CHr. Each nonvolatile memory chip may have the same constitution as the nonvolatile memory device 100 described with reference to FIGS. 1 through 5. The controller 3200 may have the same constitution as the controller 1200 described with reference to FIG. 8.

Figure 11:
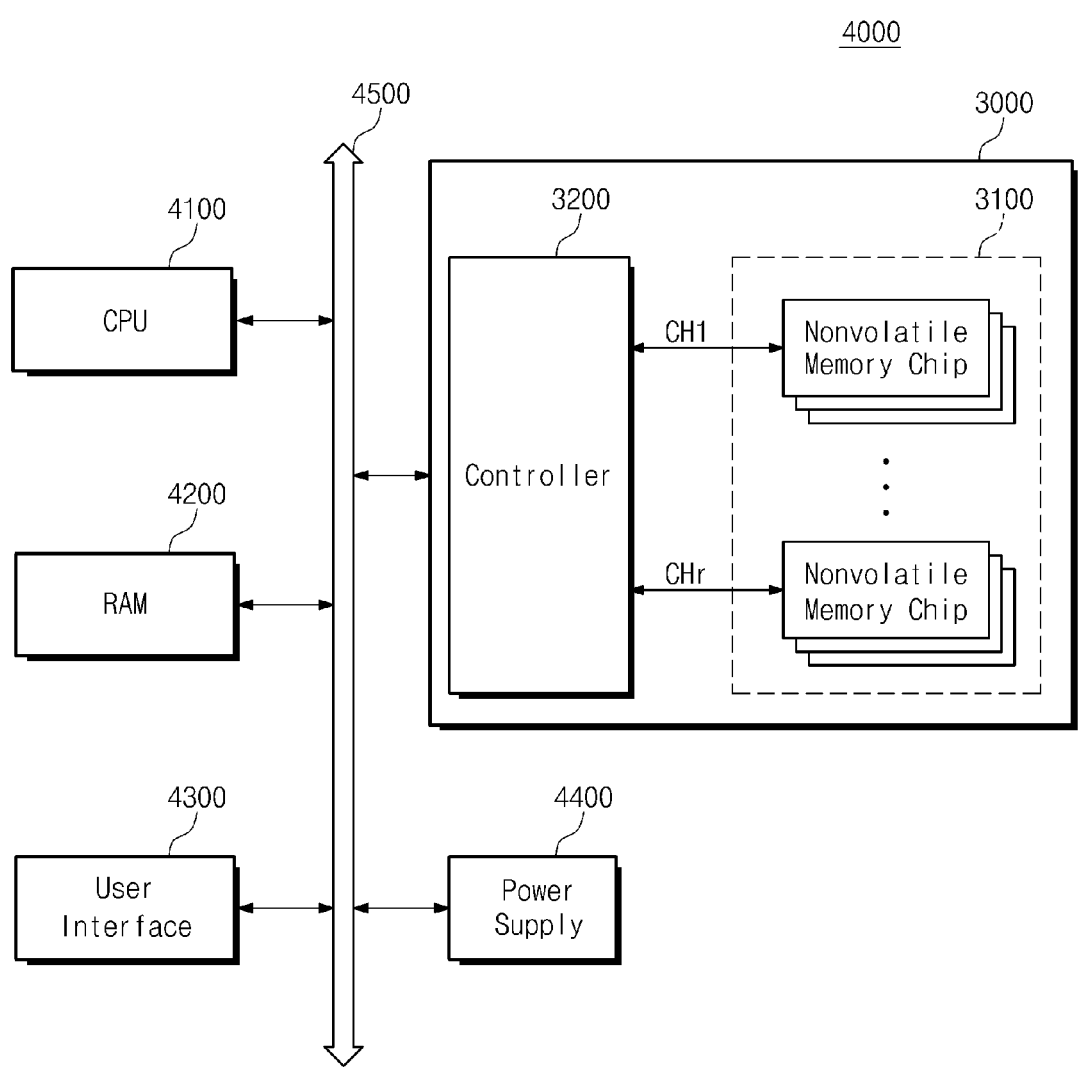
FIG. 11 is a block diagram illustrating an exemplary computing system including the memory system described with reference to FIG. 10, according to certain embodiments.

FIG. 11 is a block diagram illustrating an exemplary computing system 4000 including the memory system 3000 described with reference to FIG. 10, according to one embodiment.

Referring to FIG. 11, the computing system 4000 includes a central processing unit 4100, a random access memory (RAM) 4200, a user interface 4300, a power supply 4400 and the memory system 3000.

The memory system 3000 is connected to the central processing unit (CPU) 4100, the random access memory (RAM) 4200, the user interface 4300 and the power supply 4400 through a system bus 4500. Data provided through the user interface 4300 or processed by the central processing unit (CPU) 4100 is stored in the memory system 3000. The memory system 3000 includes the controller 3200 and the nonvolatile memory device 3100.

In FIG. 11, it is illustrated that the nonvolatile memory device 3100 is connected to the system bus 4500 through the controller 3200. However, the nonvolatile memory device 3100 may be configured to directly be connected to the system bus 4500. In this embodiment, a function of the controllers 1200 and 3200 described with reference to FIGS. 8 and 10 may be performed by the central processing unit (CPU) 4100.

In FIG. 11, it is illustrated that the memory system 3000 described with FIG. 10 is provided. However, the memory system 3000 can be replaced with the memory system 1000 described with reference to FIG. 8.

As an illustration, the computing system 4000 may be configured to include the memory systems 1000 and 3000 described with reference to FIGS. 8 and 10.

As described above, according to a program method of the nonvolatile memory device 100 in accordance with an embodiment of the inventive concept, not only the least significant bit (LSB) data of memory cells of the selected word line but also the least significant bit (LSB) data of memory cells of an unselected word line adjacent to the selected word line can be protected. Thus, data reliability of the nonvolatile memory device is improved.

The features of the inventive concept were described by a nonvolatile memory device where two-bit data are stored in one memory cell. However, the inventive concept may be applied to a nonvolatile memory device where at least three bits of data are stored in one memory cell. As an illustration, in a nonvolatile memory device where four bits of data are stored in each memory cell, according to an embodiment of the inventive concept, the least significant bit (LSB) data, the second bit (2SB) and the third bit (3SB) of the selected word line and an unselected word line adjacent to the selected word line are protected.

Having described the exemplary embodiments of the inventive concept, it is further noted that it is readily apparent to those of reasonable skill in the art that various modifications may be made without departing from the spirit and scope of the inventive concept which is defined by the metes and bounds of the appended claims.

What is claimed is:

1. A nonvolatile memory device, comprising:
a memory cell array including a first memory block including a first word line having first memory cells and a second word line having second memory cells, each of the first memory cells and second memory cells configured to store first-bit data and second-bit data;
a read/write circuit configured to program data into the first and second memory cells and read data stored in the first and second memory cells; and
a backup circuit configured to, after first-bit data are programmed into the first word line, but before second-bit data are programmed into the first word line, store first-bit data stored in the second memory cells of the second word line.

2. The nonvolatile memory device of claim 1, wherein the second word line is immediately adjacent to the first word line.

3. The nonvolatile memory device of claim 1, further comprising a switch circuit connected to the memory cell array, the read/write circuit and the backup circuit, wherein when first-bit data stored in the first memory cells of the first word line are stored in the read/write circuit, the switch circuit is configured to electrically connect the memory cell array and the read/write circuit.

4. The nonvolatile memory device of claim 3, wherein when first-bit data stored in the second memory cells of the second word line are stored in the backup circuit, the switch circuit is configured to electrically connect the memory cell array and the backup circuit.

5. The nonvolatile memory device of claim 3, wherein when second-bit data are programmed into the first memory cells of the first word line, the switch circuit is configured to electrically connect the memory cell array and the read/write circuit.

6. The nonvolatile memory device of claim 1, wherein in the case that an error occurs while second-bit data stored in the read/write circuit are programmed, the backup circuit is configured to provide first-bit data stored in the backup circuit to a second memory block.

7. The nonvolatile memory device of claim 6, wherein in the case that an error occurs while second-bit data stored in the read/write circuit are programmed, the read/write circuit is configured to provide first-bit data stored in the read/write circuit to a second memory block.

8. The nonvolatile memory device of claim 1, wherein the nonvolatile memory device is part of a memory system that includes the nonvolatile memory device and a controller configured to control the nonvolatile memory device.

9. The nonvolatile memory device of claim 8, wherein the nonvolatile memory device and the controller form one of: a solid state drive, and a memory card.

10. A method of programming a nonvolatile memory device including a memory cell array including memory cells configured to store first-bit data and second-bit data, the method comprising:
receiving second-bit data to be programmed into memory cells of a first word line among a plurality of word lines of the memory cell array;
backing up first-bit data stored in memory cells of a second word line adjacent to the first word line; and
subsequent to the backing up, programming the received second-bit data in the memory cells of the first word line.

11. The method of claim 10, wherein receiving second-bit data to be programmed into the first word line is performed together with backing up first-bit data stored in the memory cells of the second word line.

12. The method of claim 10, further comprising before programming the received second-bit data, reading first-bit data stored in the memory cells of the first word line, wherein programming second-bit data in the memory cells of the first word line is programming on the basis of first-bit data read from the memory cells of the first word line, and the received second-bit data.

13. The method of claim 10, further comprising, when an error occurs while programming the second bit data in the memory cells of the first word line, programming first-bit data intended for the memory cells of the first word line to a memory block that is not defective.

14. The method of claim 10, further comprising, when an error occurs while programming the second bit data in the memory cells of the first word line, programming the backed up first-bit data to a memory block that is not defective.

15. A method of programming a nonvolatile memory device including memory cells, each cell configured to store at least first-bit data and second-bit data, the method including:
receiving first data including first-bit data to be programmed to memory cells connected to a particular word line of the nonvolatile memory device;
receiving second data including first-bit data to be programmed to memory cells connected to a different word line of the nonvolatile memory device;
receiving third data including second-bit data to be programmed to the memory cells connected to the particular word line of the nonvolatile memory device;
programming the first data to the memory cells connected to the particular word line and programming the second data to the memory cells connected to the different word line, prior to programming the third data to the particular word line; and storing backup data including a copy of the second data in a backup circuit, prior to programming the third data to the particular word line.

16. The method of claim 15, wherein the particular word line is immediately adjacent the different word line.

17. The method of claim 15, wherein the voltages applied to the particular word line affect the data stored in cells connected to the different word line.

18. The method of claim 15, wherein:

the particular word line and the different word line are included in a first memory block, and further comprising:

if an error occurs while programming the third data to the particular word line, copying the backup data to a word line of a second memory block.

19. The method of claim 15, further comprising:

storing the backup data by storing the second data in the backup circuit prior to programming the third data to the particular word line.

20. The method of claim 19, wherein:

the first data is programmed to the particular word line prior to the second data being programmed to the different word line; and storing the backup data includes storing the second data in the backup circuit after the first data is programmed to the particular word line and before the start of programming the third data to the particular word line.

\* \* \* \* \*